United States Patent
Gouk et al.

(10) Patent No.: US 11,281,094 B2
(45) Date of Patent: Mar. 22, 2022

(54) METHOD FOR VIA FORMATION BY MICRO-IMPRINTING

(71) Applicant: Applied Materials, Inc., Santa Clara, CA (US)

(72) Inventors: Roman Gouk, San Jose, CA (US); Giback Park, San Jose, CA (US); Kyuil Cho, Santa Clara, CA (US); Han-Wen Chen, Cupertino, CA (US); Chintan Buch, Sunnyvale, CA (US); Steven Verhaverbeke, San Francisco, CA (US); Vincent Dicaprio, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 450 days.

(21) Appl. No.: 16/192,546

(22) Filed: Nov. 15, 2018

(65) Prior Publication Data
US 2020/0159113 A1     May 21, 2020

(51) Int. Cl.
*G03F 7/038*     (2006.01)
*G03F 7/00*      (2006.01)
(Continued)

(52) U.S. Cl.
CPC .......... *G03F 7/0002* (2013.01); *G03F 7/0035* (2013.01); *G03F 7/2004* (2013.01); *H01L 21/768* (2013.01)

(58) Field of Classification Search
CPC .... G03F 7/0002; G03F 7/0035; G03F 7/2004; G03F 7/038; G03F 7/0387; H01L 21/768; H01L 21/76817
See application file for complete search history.

(56) References Cited

U.S. PATENT DOCUMENTS 5,091,339 A * 2/1992 Carey ............... H01L 21/31144
216/18
8,545,709 B2    10/2013 Brooks et al.
(Continued)

FOREIGN PATENT DOCUMENTS

WO    2017057263 A1    4/2017

OTHER PUBLICATIONS

International Search Report and the Written Opinion for International Application No. PCT/US2019/058455 dated Feb. 17, 2020, 12 pages.

*Primary Examiner* — Nghia M Doan
(74) *Attorney, Agent, or Firm* — Patterson + Sheridan, LLP (57) ABSTRACT

A method and apparatus for forming a plurality of vias in panels for advanced packaging applications is disclosed, according to one embodiment. A redistribution layer is deposited on a substrate layer. The redistribution layer may be deposited using a spin coating process, a spray coating process, a drop coating process, or lamination. The redistribution layer is then micro-imprinted using a stamp inside a chamber. The redistribution layer and the stamp are then baked inside the chamber. The stamp is removed from the redistribution layer to form a plurality of vias in the redistribution layer. Excess residue built-up on the redistribution layer may be removed using a descumming process. A residual thickness layer disposed between the bottom of each of the plurality of vias and the top of the substrate layer may have thickness of less than about 1 μm.

17 Claims, 8 Drawing Sheets

(51) Int. Cl.
*H01L 21/768* (2006.01)
*G03F 7/20* (2006.01)

(56) References Cited

U.S. PATENT DOCUMENTS

| | | | |
|---|---|---|---|
| 9,159,925 B2 | 10/2015 | Defranco | |
| 10,189,203 B2 | 1/2019 | Youn et al. | |
| 10,727,083 B1 * | 7/2020 | Gouk | H01L 21/4846 |
| 2005/0170670 A1 | 8/2005 | King et al. | |
| 2007/0238317 A1 | 10/2007 | Allen et al. | |
| 2008/0003818 A1 | 1/2008 | Seidel et al. | |
| 2009/0314525 A1 | 12/2009 | Kajino et al. | |
| 2011/0031658 A1 * | 2/2011 | Saifullah | B29C 43/021 |
| | | | 264/496 |
| 2013/0009319 A1 | 1/2013 | Shao et al. | |
| 2016/0263814 A1 * | 9/2016 | Youn | C08L 79/08 |
| 2018/0374696 A1 * | 12/2018 | Chen | H01L 21/311 |

* cited by examiner

METHOD FOR VIA FORMATION BY MICRO-IMPRINTING

BACKGROUND

Field

Embodiments of the present disclosure generally relate to methods of micro-imprinting panels for advanced packaging applications.

Description of the Related Art

As circuit densities increase and device sizes decrease for next generation semiconductor devices, providing the external connections, i.e., wiring, to these devices requires advanced packaging technologies. One such packaging technology is wafer level packaging.

Wafer level packaging streamlines the manufacturing and packaging processes of semiconductor devices by integrating device manufacturing, package assembly (packaging), electrical testing, and reliability testing (burn-in) at the wafer level, where forming of the top and bottom layers of the packaging, creating the I/O connections, and testing the packaged device are all performed before the devices are singulated into individual packaged components. The advantages of wafer level packaging include reduced overall manufacturing costs of the resulting device, reduced package size, and improved electrical and thermal performance.

Wafer level packaging generally comprises depositing a redistribution layer on a substrate layer, and forming a plurality of vias in the redistribution layer using lithography processes. Using conventional lithography process to form the plurality of vias can be expensive, waste material, lack resolution beyond 7 µm in advanced node high density redistribution layers, and be very sensitive to surface topologies. Additionally, the redistribution layers are typically deposited using conventional photolithography and etch processes which are costly, equipment intensive, and time consuming. Using these methods to deposit and pattern the redistribution layer may result in a significant amount of excess material being wasted, and may make controlling the size and depth of the vias difficult to control.

Accordingly, there is a need in the art for improved methods of depositing and forming vias in redistribution layers in wafer level packaging schemes.

SUMMARY

The present disclosure generally relates to methods of forming a plurality of vias in panels for advanced packaging applications. A redistribution layer is deposited on a substrate layer. The redistribution layer may be deposited using a spin coating process, a spray coating process, a drop coating process, or lamination. The redistribution layer is then micro-imprinted using a stamp inside a chamber. The redistribution layer and the stamp are then baked inside the chamber. The stamp is removed from the redistribution layer to form a plurality of vias in the redistribution layer. Excess residue built-up on the redistribution layer may be removed using a descumming process. A residual thickness layer disposed between the bottom of each of the plurality of vias and the top of the substrate layer may have thickness of less than about 1 µm.

In one embodiment, a method of forming a plurality of vias in a panel comprises depositing a polyimide layer on a substrate layer, micro-imprinting the polyimide layer with a stamp inside a chamber, baking the polyimide layer and the stamp inside the chamber, exposing the polyimide layer and the stamp to UV light, removing the stamp from the polyimide layer to form a plurality of vias in the polyimide layer, performing an oven curing process on the polyimide layer, and descumming the polyimide layer to remove excess residue.

In another embodiment, a method of forming a plurality of vias in a panel comprises micro-imprinting a flowable epoxy layer with a stamp inside a chamber, the flowable epoxy layer comprising silica particle fillers, baking the flowable epoxy layer and the stamp inside the chamber, and removing the stamp from the flowable epoxy layer to form a plurality of vias in the flowable epoxy layer.

In yet another embodiment, a method of forming a plurality of vias in a panel comprises depositing a polyimide layer on a substrate layer using a drop coat process, micro-imprinting the polyimide layer with a stamp inside a chamber, baking the polyimide layer and the stamp inside the chamber, exposing the polyimide layer and the stamp to UV light, removing the stamp from the polyimide layer to form a plurality of vias in the polyimide layer, and performing an oven curing process on the polyimide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method and apparatus for forming a plurality of vias in panels for advanced packaging applications is disclosed, according to one embodiment. A redistribution layer is deposited on a substrate layer. The redistribution layer may be deposited using a spin coating process, a spray coating process, a drop coating process, or lamination. The redistribution layer is then micro-imprinted using a stamp inside a chamber. The redistribution layer and the stamp are then baked inside the chamber. The stamp is removed from the redistribution layer to form a plurality of vias in the redistribution layer. Excess residue built-up on the redistribution layer may be removed using a descumming process. A residual thickness layer disposed between the bottom of each of the plurality of vias and the top of the substrate layer may have thickness of less than about 1 μm.

FIG. 1A-1I illustrate various stages of micro-imprinting a redistribution layer 104 on a substrate 100 to form a plurality of vias 118. FIG. 2 illustrates a method of micro-imprinting a layer on a substrate to form a plurality of vias, according to one embodiment. While FIGS. 1A-1I are shown in in a particular sequence, it is also contemplated that the various stages of method 200 depicted in FIGS. 1A-1A can be performed in any suitable order. To facilitate a clearer understanding of the method 200, the method 200 of FIG. 2 will be described and demonstrated using the various views of the substrate 100 of FIGS. 1A-1I. While the method 200 is described using FIGS. 1A-1I, other operations not shown in FIGS. 1A-1I may be included.

Figure 1A:
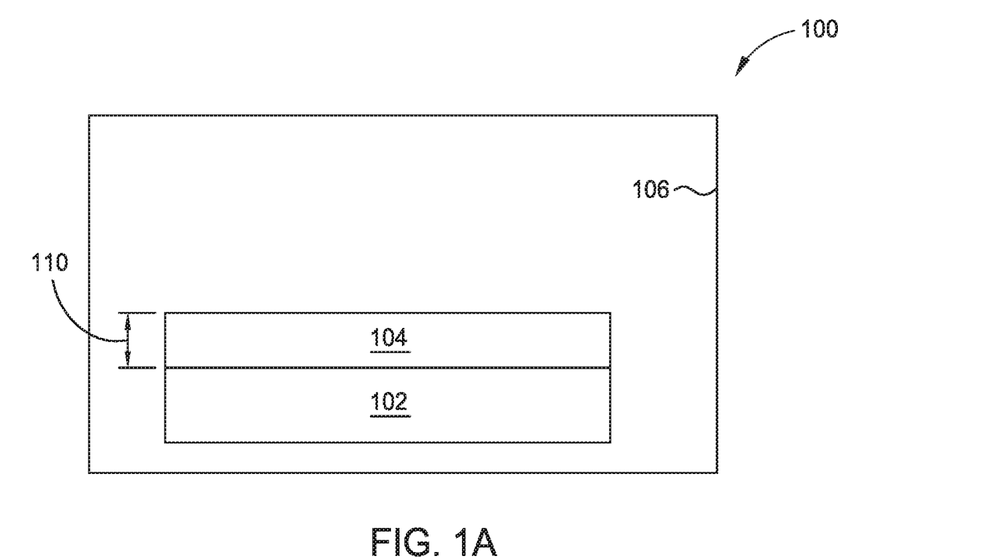
FIG. 1A-1I illustrate various stages of micro-imprinting a layer on a substrate to form a plurality of vias, according to one embodiment.
Figure 1B:
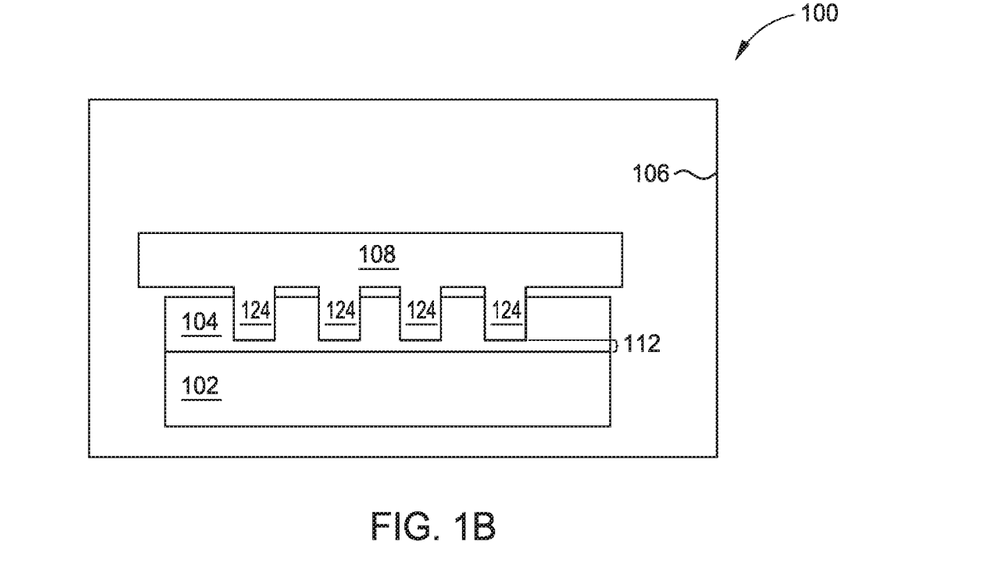
Figure 1H:
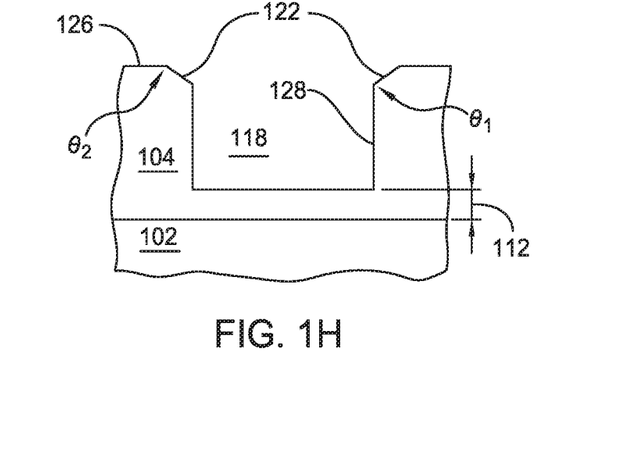
Figure 2:
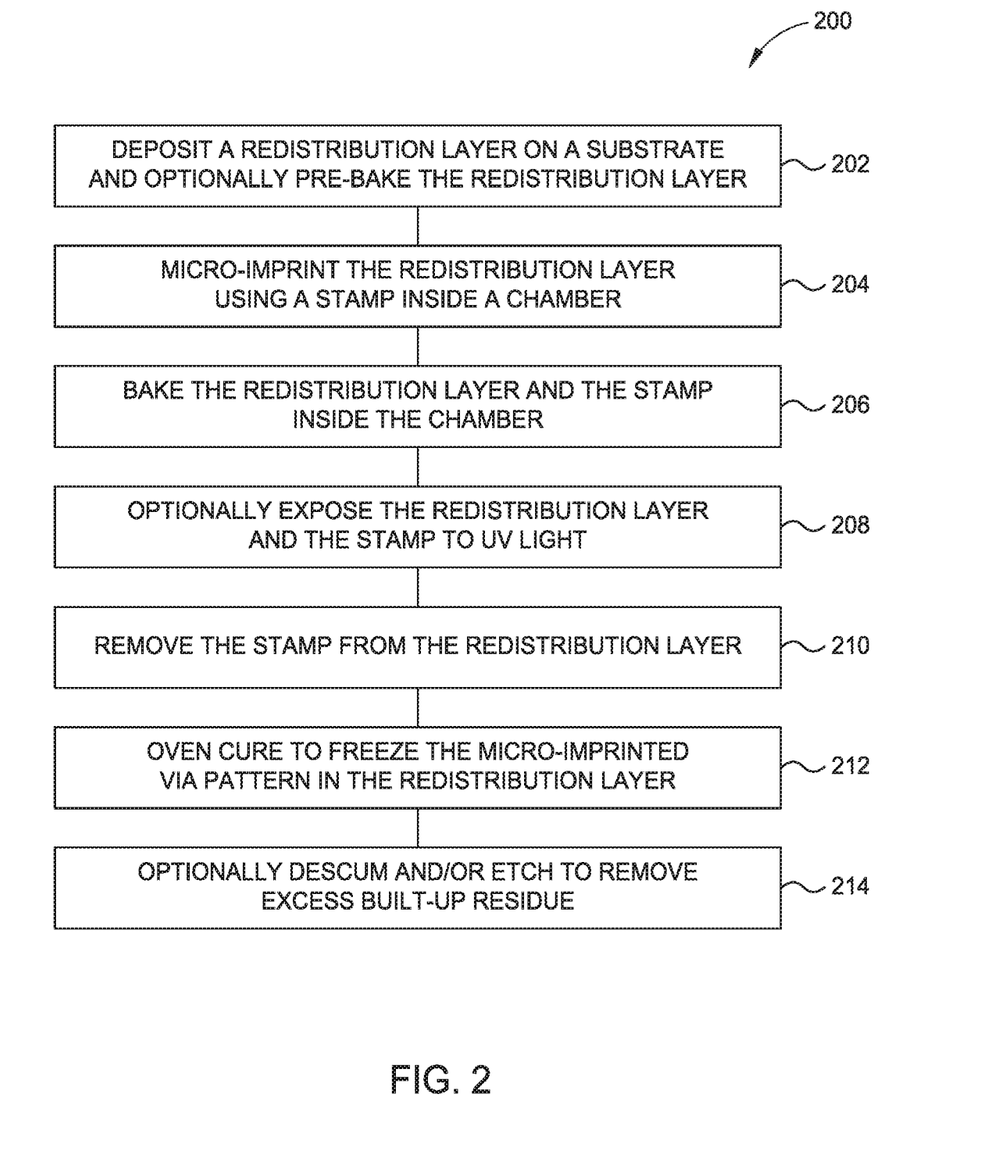
FIG. 2 illustrates a method of micro-imprinting a layer on a substrate to form a plurality of vias, according to one embodiment.

FIG. 1A illustrates a substrate 100, or a portion of a panel or wafer, having a redistribution layer (RDL) 104 being deposited on a substrate layer 102 in a chamber 106, as performed in operation 202 of method 200 of FIG. 2. The RDL 104 may be a dielectric layer. In one embodiment, the RDL 104 is pre-baked in the chamber 106 at a temperature between about 75-90 degrees Celsius for about 30-45 seconds, such as 30 seconds. The RDL 104 is deposited to have a thickness 110 between about 5 μm to 15 μm. The thickness 110 of the RDL 104 is selected to minimize a residual thickness layer (RTL) 112 (shown in FIGS. 1B and 1H) after imprinting. The RTL 112 is the total thickness 110 of the RDL 104 minus the depth 124 of the imprint. In other words, the RTL 112 is the amount of the material of the RDL 104 remaining between the top of the substrate layer 102 and the bottom of an imprinted via after being micro-imprinted with a stamp 108. In one embodiment, the thickness 110 of the RDL 104 is selected such that the RTL 112 is less than about 2 μm, such as less than 1 μm.

In one embodiment, the RDL 104 is a polyimide layer. The polyimide may be an n-type photosensitive polyimide. In such an embodiment, the polyimide layer may be deposited by a spin coating process, a spray coating process, or a drop array pattern coating process. If the polyimide layer is deposited using a spin coating process or a spray coating process, the RDL 104 may be pre-baked after being deposited to evaporate a portion of solvent, which maximizes the imprint depth and minimizes pattern distortion due to the polyimide material hardening. Utilizing the spray coating process may enable the polyimide layer to be self-planarizing. If the polyimide layer is pre-baked, the polyimide material remains flowable and imprintable.

If the polyimide layer is deposited using a drop coating process, the RDL 104 may not be pre-baked after being deposited. When utilizing the drop coating process, the polyimide may be deposited in a hatched array pattern with controlled drop size and pitch. For example, the polyimide drops may be deposited in a cross-hatched pattern having a diameter between about 440-500 μm and a pitch between about 500-800 μm. In one embodiment, the drops had a diameter of about 450 μm and a pitch of about 570 μm. Utilizing the drop coating process may enable the polyimide layer to be self-planarizing. Depositing the polyimide layer using the drop coating process may result in minimal or no material waste.

In another embodiment, the RDL 104 is a flowable epoxy layer. The flowable epoxy layer may be a flowable epoxy compound comprising silica particle fillers. The flowable epoxy layer may comprise one or more materials that are flowable at a temperature range of about 90-180 degrees Celsius and have a curing temperature of about 180 degrees or above. In such an embodiment, the flowable epoxy layer is deposited by a lamination process at a temperature of about 90-110 degrees Celsius. If the flowable epoxy is utilized as the RDL 104, the RDL 104 may not be pre-baked after being deposited. In one embodiment, the substrate layer 102 and the flowable epoxy layer are thermally matched using the coefficient of thermal expansion (CTE).

FIG. 1B illustrates micro-imprinting the RDL 104 using a stamp 108 and substrate compression in the chamber 106, as performed in operation 204 of method 200. The stamp 108 is applied to the RDL 104 with a pressure of about 1 bar or greater, resulting in the reverse tone image of the stamp pattern in the RDL 104 (i.e. the pillars of the stamp 108 creating vias or holes in the RDL). The pressure is applied for about 1-2 minutes. In one embodiment, the imprinting of the substrate 100 is done in a vacuum environment. The substrate 100 and/or the stamp 108 may be heated to about 50 to 100 degrees Celsius during the imprinting. The RDL 104 is a flowable layer such that the RDL 104 conforms to the pattern of the stamp 108. The stamp 108 may comprise a UV transparent material. In one embodiment, the stamp 108 is comprised of a UV transparent material which allows UV wavelengths in the range of about 350-390 nm to pass through the stamp 108. The stamp 108 may be comprised of polydimethylsiloxane (PDMS). The PDMS comprising stamp 108 enables stiction-free stamp detachment and allows for solvent absorption.

In one embodiment utilizing a flowable epoxy layer as the RDL 104, the epoxy layer is laminated to the stamp 108, and the stamp 108 is then attached to the substrate layer 102. The stamp 108 and RDL 104 are then brought to the flowable temperature range of the epoxy film. The flowable temperature range of the epoxy film may be close to the curing temperature of the epoxy film, such as between about 140-180 degrees Celsius.

Figure 1C:
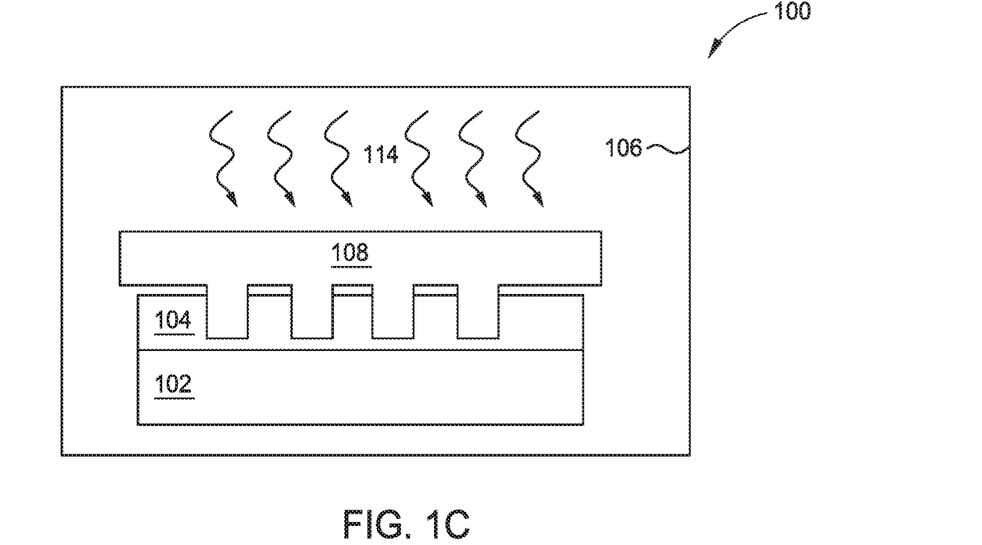

FIG. 1C illustrates baking the RDL 104 imprinted with the stamp 108 inside the chamber 106 by exposing the substrate 100 to heat 114, as performed in operation 206 of method 200. The bake may be done at a temperature between about 80-200 degrees Celsius. For example, in an embodiment where polyimide is utilized as the RDL 104, the bake may be done at a temperature between about 80-120 degrees Celsius for about 30-60 minutes. Additionally, when polyimide is utilized as the RDL 104, the temperature and time of the in-chamber bake may be used to reduce and control the RTL 112. For example, baking the polyimide layer having a thickness of about 6 μm at a temperature of about 100 degrees Celsius for about 2 minutes may reduce the RTL 112 from about 2 μm to about 0.5 μm. In another embodiment where a flowable epoxy material is used as the RDL 104, the bake may be done at a temperature between about 180-200 degrees Celsius for about 1-5 minutes. In such an embodiment where a flowable epoxy material is used, the baking temperature may be the curing temperature.

Figure 1D:
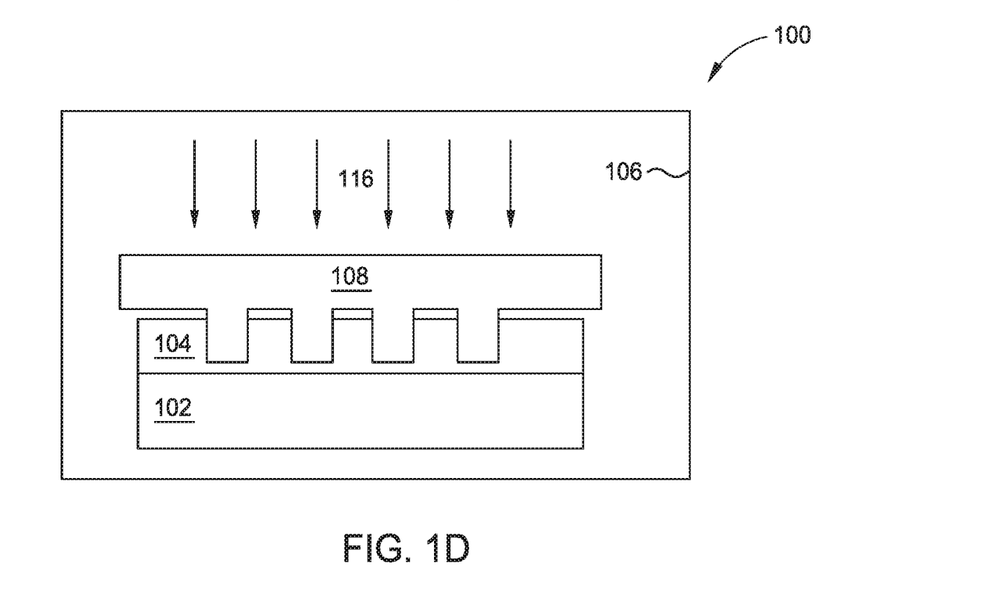

FIG. 1D illustrates optionally UV curing the RDL 104 and the stamp 108 by exposing the substrate 100 to UV light 116, as performed in operation 208 of method 200. In one embodiment, the UV light 116 is applied for about 2 minutes at a temperature between about 25-100 degrees Celsius. The UV curing may be done by applying a UV light 116 having a wavelength between about 360-370 nm, such as 365 nm.

In an embodiment where the RDL 104 is comprised of a flowable epoxy material, the substrate 100 may not be UV cured in operation 208, as the baking performed in operation 206 may constitute the pre-cure processes. In such an embodiment, method 200 proceeds directly from operation 206 to operation 210.

Figure 1E:
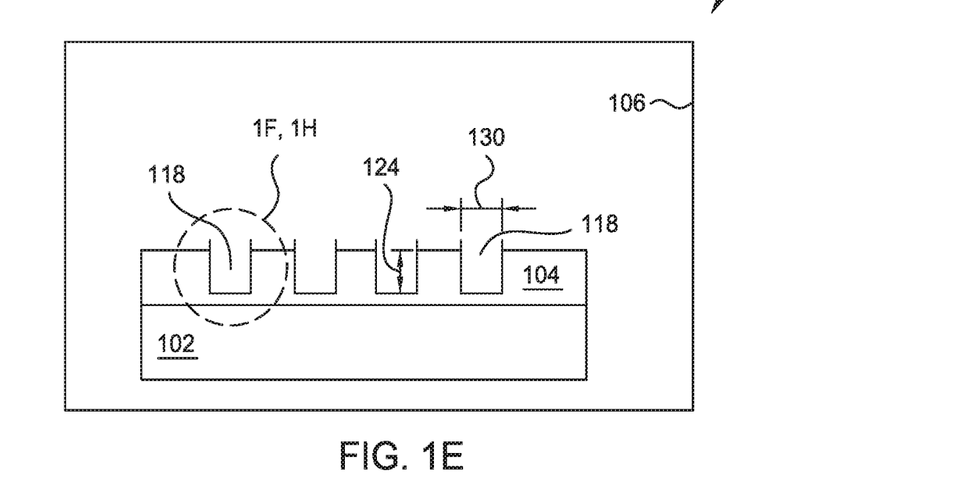

FIG. 1E illustrates removing the stamp 108 from the RDL 104, as performed in operation 210 of method 200. The stamp 108 may be baked in a vacuum after being removed from the RDL 104 to remove any residual solvent. In an embodiment where a flowable epoxy is utilized, the stamp 108 may be demolded at a temperature of about 90-180 degrees Celsius. The RDL 104 may then be oven cured to freeze the plurality of vias 118 formed from the micro-imprinted pattern, as performed in operation 212 of method 200. Depending on the thickness 110 of the RDL 104 when deposited and the stamp 108 used for imprinting, each via 118 may have a depth 124 between about 2-12 µm and a diameter 130 between about 0.5-50 µm after being oven cured. In one embodiment, each via 118 has a depth 124 less than about 8 µm and an RTL of less than about 1 µm after being oven cured.

Moreover, if the RDL 104 is deposited to have a thickness of about 10 µm, a stamp 108 having a pattern comprising of pillars having a diameter between about 5-50 µm and a height of about 10-12 µm may be used. Similarly, if the RDL 104 is deposited to have a thickness of about 5 µm, a stamp 108 having a pattern comprising of pillars having a diameter between about 2-10 µm and a height of about 5-6 µm may be used. The stamp 108 pillars may be designed such that the pillar height is the same or up to 20% higher than that of the depth of the vias 118, allowing the vias to be formed with little to no excess residue. For example, if the RDL 104 is about 10 µm thick, a stamp 108 having a pillar height of about 10-12 µm may be used. In an embodiment where a flowable epoxy layer is used as the RDL 104, the pillars of the stamp 108 may be the same or taller than the thickness of the RDL 104.

Figure 1F:
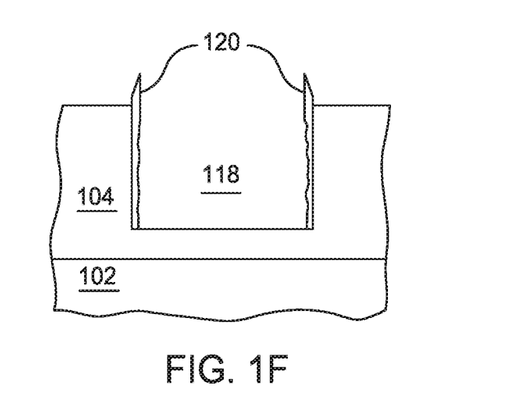
Figure 1G:
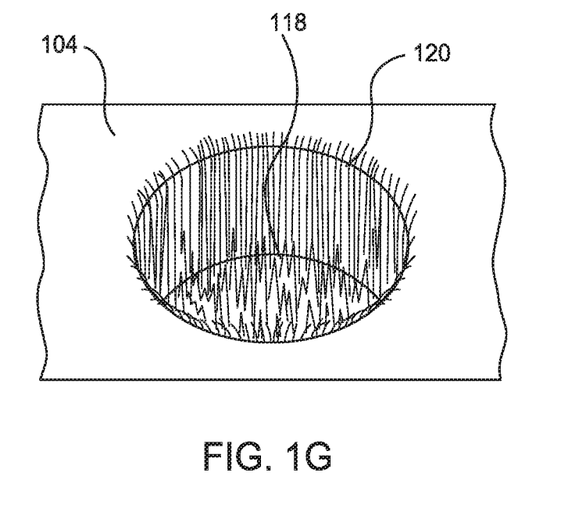
Figure 1I:
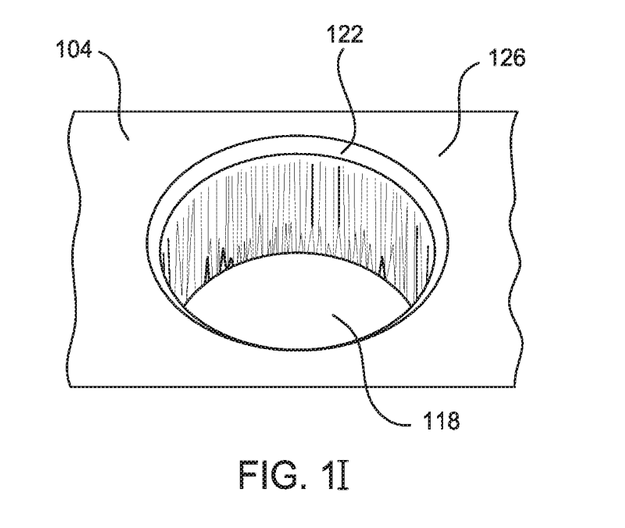

FIGS. 1F-1I illustrates a close up view of a micro-imprinted via 118 of FIG. 1E. FIG. 1F illustrates a side view of the via 118 having excess residue 120 built up, according to one embodiment. FIG. 1G illustrates a perspective top view of the via 118 having excess residue 120, according to another embodiment. FIG. 1H illustrates a side view of the via 118 having little to no excess residue. FIG. 1I illustrates a perspective top view of the via 118 having little to no excess residue. Excess residue (i.e. extra built up RDL material) may accumulate in and around the vias 118 due to heating the RDL 104. Depending on the material selected for the RDL 104, excess residue may or may not build up. For example, in one embodiment, the vias 118 are only des-cummed and etched when the RDL 104 comprises polyimide, and the vias 118 are not descummed when the RDL 104 comprises a flowable epoxy. However, if excess residue is accumulated when heating the flowable epoxy layer, the descum process may be performed. If no excess residue is built up, the vias 118 need not be descummed, and the vias 118 will have little to no excess residue following the baking of operation 212, and method 200 ends at operation 212. If the vias 118 have excess residue built up, a descumming process will be performed to remove the excess residue, as performed in operation 214 of method 200.

In operation 214, the micro-imprinted vias are optionally descummed to remove the excess built-up residue. The descumming process is performed while maintaining a temperature of about 0-20 degrees Celsius. To remove the residue, the substrate 100 may be etched with a 10:1 mixture of oxygen ($O_2$) and tetrafluoro methane ($CF_4$) and then cooled using helium (He) or nitrogen ($N_2$). The substrate 100 may be etched and cooled one or more times. For example, the substrate 100 may be etched and then cooled one to three times. Additionally, if the RTL 112 is equal to or lesser than about 0.5 µm thick, the $O_2/CF_4$ etch and cooling processes may not be performed at all. The substrate 100 may be etched with $O_2/CF_4$ for about 10-40 seconds at an RF power of about 500-800 watts and a bias of about 50-100 watts. The $N_2$ or He cooling period may occur for about 30-60 seconds. Following the one or more etching and cooling processes, a 4:2 mixture of argon (Ar) and hydrogen ($H_2$) may be used to clean and level off the rims 122 of the vias 118. The substrate 100 may be cleaned using the $Ar/H_2$ mixture for about 40-60 seconds at an RF power of about 800-1000 watts and a bias of about 100-200 watts.

Following the descumming process of operation 214, the rim 122 of the via 118 may be tapered and smooth such that the surface of the rim 122 is defined by a first angle $\theta_1$ from the sidewall 128 of the via 118 and a second angle $\theta_2$ from the surface 126 of the RDL 104, as shown in FIG. 1H. Both the first and second angles $\theta_1$, $\theta_2$ may be greater than 90 degrees (i.e. obtuse). The vias 118 may have an overall circular, cylindrical, or conical frustum shape. The vias 118 may have a larger diameter at the surface 126 of the RDL 104 than the diameter at the bottom of the via 118 disposed adjacent to the RTL 112 and substrate layer 102. In other words, the sidewalls 128 of the vias 118 may be angled or tapered such that the vias 118 have a conical frustum shape. The RTL 112 of the vias 118 may be between 0-2 µm thick.

Figure 3A:
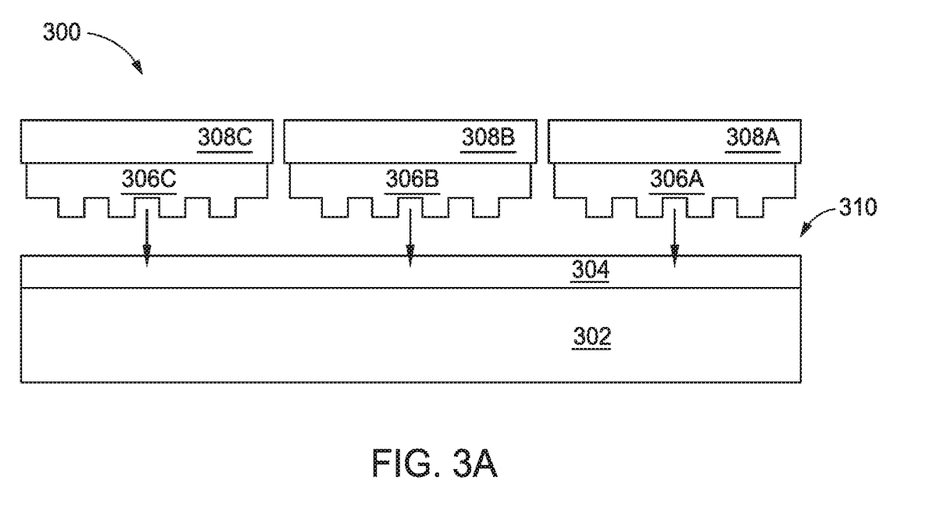
FIGS. 3A-3B illustrate micro-imprinting stamps, according to various embodiments.
Figure 3B:
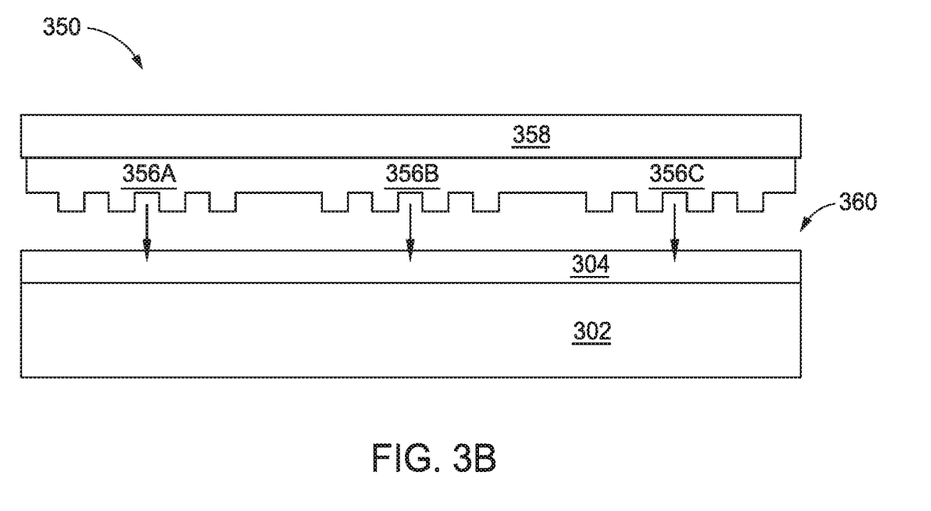

FIGS. 3A-3B illustrate various embodiments of stamp layouts 300, 350 used for micro-imprinting. FIG. 3A illustrates one or more stamps 306A-306C disposed in a multi-stamp layout 300 while FIG. 3B illustrates a plurality of stamps 356A-356C disposed in a full field stamp layout 350. The stamps 306A-306C, 356A-356C may be the stamp 108 of FIGS. 1A-1I, the RDL 304 may be the RDL 104 of FIGS. 1A-1I, and the substrate layer 302 may be the substrate layer 102 of FIGS. 1A-1I.

The stamps 306A-306C, 356A-356C may be comprised of a soft or hard material, and may have a thickness between about 0.5-2 mm. The stamps 306A-306C, 356A-356C may comprise a UV transparent material. In one embodiment, the stamps 306A-306C, 356A-356C are comprised of a UV transparent material which allows UV wavelengths in the range of about 350-390 nm to pass through the stamps 306A-306C, 356A-356C. In one embodiment, the stamps 306A-306C, 356A-356C are comprised of PDMS. The PDMS comprising stamps 306A-306C, 356A-356C enable stiction-free stamp detachment and allow for solvent absorption. In one embodiment, the stamps 306A-306C, 356A-356C may have a pattern comprising of pillars having a diameter between about 8-12 µm spaced a distance of about 8-15 µm apart. In another embodiment, the stamps 306A-306C, 356A-356C may have a pattern comprising of pillars having a diameter between about 4-6 µm spaced a distance of about 3-10 µm apart.

In a multi-stamp layout 300 of FIG. 3A, one or more stamps 306A-306C are used to micro-imprint a RDL 304 disposed on a substrate layer 302. Each stamp 306A-306C may be coupled to a separate backing 308A-308C. The backings 308A-308C may be glass backings. Utilizing a multi-stamp layout 300 enables precise alignment when imprinting the RDL 304. One stamp 306A may be used to imprint each portion of the panel or substrate 310 individually, or a plurality of stamps 306A-306C may be used to imprint the substrate 310 at once. For example, any number of stamps 306A-306C may be used, or as many as needed, to imprint the entire substrate 310 at once, with each stamp 306A-306C being individually aligned with other stamps 306A-306C and the substrate 310. The stamps 306A-306B may be applied to the substrate 310 in a gradual way radially (i.e. center to edge), or linearly from one edge to the opposite edge (e.g. right to left or left to right).

In the full field stamp layout 350 of FIG. 3B, a plurality of stamps 356A-356C is coupled to a single backing 358. The backing 358 may be a glass backing. The plurality of stamps 356A-356C may be stitched to the backing 358 with high accuracy to ensure precise alignment when imprinting the panel or substrate 360. In such an embodiment, the backing 358 is aligned with the substrate 360 such that each stamp 356A-356B is in turn precisely aligned with the substrate 360. The stamps 356A-356B may be applied to the substrate 360 in a gradual way radially (i.e. center to edge), or linearly from one edge to the opposite edge (e.g. right to left/top to bottom or left to right/bottom to top).

Figure 4A:
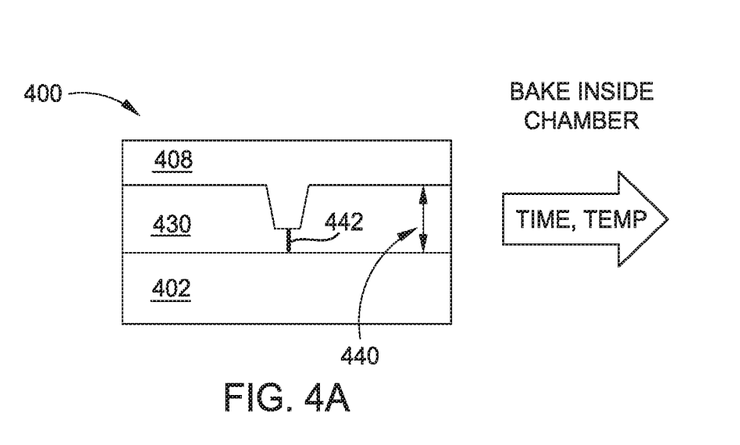
FIGS. 4A-4B illustrate the in-chamber bake reducing and controlling the RTL of a polyimide layer, according to one embodiment.
Figure 4B:
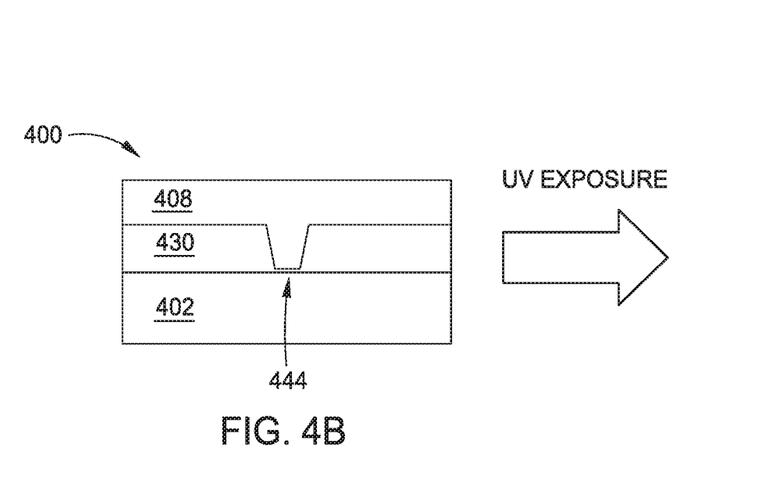

FIGS. 4A-4B illustrate the in-chamber bake reducing and controlling the RTL 432 of a polyimide layer 430, according to one embodiment. Specifically, FIG. 4A illustrates micro-imprinting the polyimide layer 430 using a stamp 408, such as shown in FIG. 1B and as described in operation 204 above. FIG. 4B illustrates the substrate 400 after the substrate 400 and stamp 408 have been baked in the chamber, such as shown in FIG. 1C and as described in operation 206 above. The substrate 400 may be the substrate 100 of FIGS. 1A-1I, the substrate layer 402 may be the substrate layer 102 of FIGS. 1A-1I, the polyimide layer 430 may be the RDL 104 of FIGS. 1A-1I, and the stamp 408 may be the stamp 108 of FIGS. 1A-1I. Additionally, the micro-imprinting process may be accomplished utilizing the method 200 of FIG. 2.

In FIGS. 4A-4B, the polyimide layer 430 is deposited on the substrate layer 402. The polyimide layer may have a thickness 440 of about 6 µm. The polyimide layer 430 may be deposited by the spin coating process, the spray coating process, or the drop array pattern coating process described above in FIGS. 1A-1I.

As shown in FIG. 4A, the RTL 432 has a thickness 442 of about 2 µm immediately after the polyimide layer 430 has been imprinted by the stamp 408. In FIG. 4B, the stamp 408 and the substrate 400 are baked in the chamber at a temperature of about 100 degrees Celsius for about 2 minutes. As such, the RTL 432 is reduced, now having a thickness 444 of about 0.5 µm. The substrate 400 and the stamp 408 may then be UV cured, such as in FIG. 1D above and as described in operation 208 above.

Figure 5A:
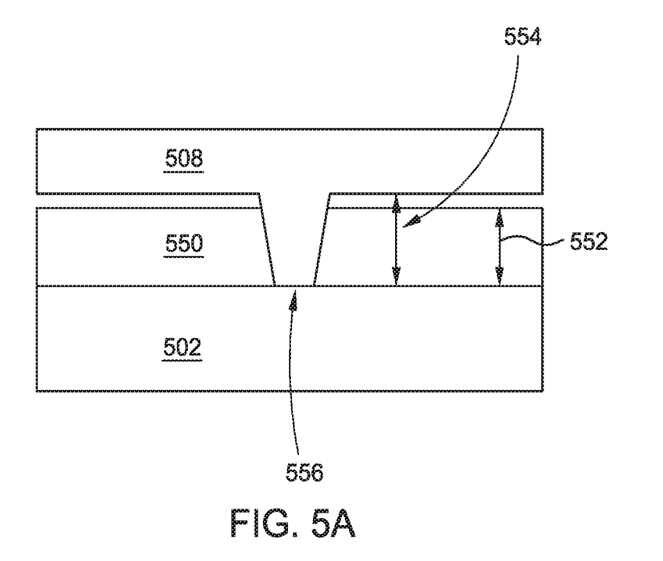
FIG. 5A illustrates a substrate utilizing a flowable epoxy layer as the RDL being micro-imprinted by a stamp, according to one embodiment.
Figure 5B:
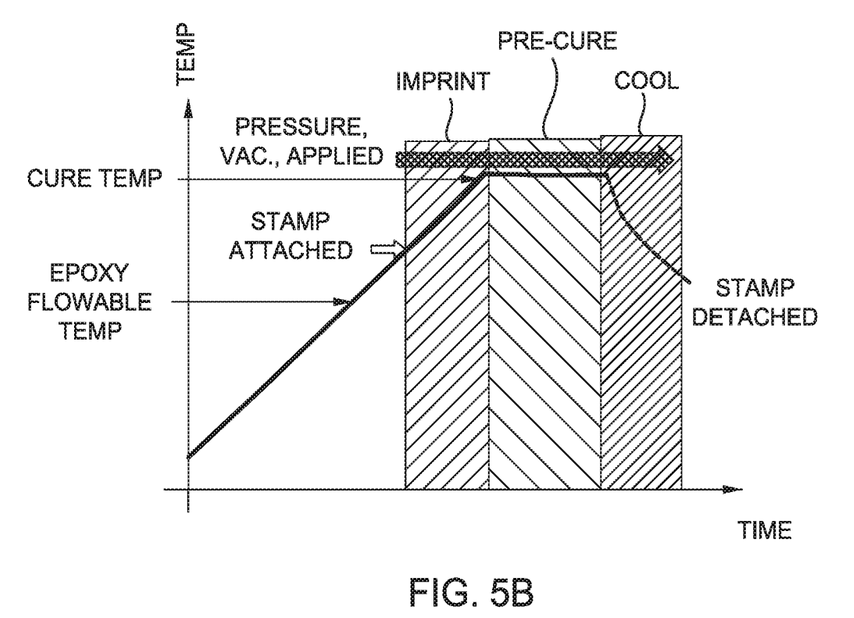
FIG. 5B illustrates a graph of time versus temperature for micro-imprinting a flowable epoxy layer, according to another embodiment.

FIG. 5A illustrates a substrate 500 utilizing a flowable epoxy layer 550 as the RDL being micro-imprinted by a stamp 508, according to one embodiment. FIG. 5B illustrates a graph of time versus temperature for micro-imprinting a flowable epoxy layer 550. The substrate 500 comprises a substrate layer 502, a flowable epoxy layer 550, and a stamp 508. The substrate 500 may be the substrate 100, of FIGS. 1A-1I, the substrate layer 502 may be the substrate layer 102 of FIGS. 1A-1I, the flowable epoxy layer 550 may be the RDL 104 of FIGS. 1A-1I, and the stamp 508 may be the stamp 108 of FIGS. 1A-1I. Furthermore, the substrate 500 may be micro-imprinted using the method 200 of FIG. 2.

The flowable epoxy layer 550 may be a silica filled epoxy layer. The flowable epoxy layer 550 may be micro-imprinted with the stamp 508 at a temperature near the cure temperature of the epoxy film, such as between about 140-180 degrees Celsius. Once the stamp 508 is imprinted into the flowable epoxy layer 550, the substrate 500 and the stamp 508 may be baked (e.g. pre-cured) in the chamber at a temperature of about 180-200 degrees Celsius for about 1-5 minutes. The thickness 552 of the flowable epoxy layer 550 is less than the height 554 of the pillars of the stamp 508. As such, the stamp 508 is in contact with the substrate layer 502, and no RTL 556 remains.

FIG. 5B illustrates a graph of time versus temperature for micro-imprinting a flowable epoxy layer 550. As shown in FIG. 5B, the stamp 508 is attached above the flowable temperature of the epoxy film 550, near the curing temperature. The substrate 500 is then pre-cured at a temperature near the curing temperature. The stamp 508 is removed from the substrate 500 during a cooling period, when the temperature is below the curing temperature.

Utilizing the above described micro-imprinting and via formation method allows a redistribution layer to be imprinted with a plurality of vias having a maximized imprint depth and minimized pattern distortion. For example, the method permits a well-controlled via depth of less than 8 µm and a residual thickness layer of less than 1 µm to be achieved. Furthermore, the micro-imprinting method does not utilize lithography processes, and as such, expenses may be saved and less material may be wasted. Additionally, higher resolution patterning may be achieved since the method does not require optical resolution properties.

In one embodiment, a method of forming a plurality of vias in a panel comprises depositing a polyimide layer on a substrate layer, micro-imprinting the polyimide layer with a stamp inside a chamber, baking the polyimide layer and the stamp inside the chamber, exposing the polyimide layer and the stamp to UV light, removing the stamp from the polyimide layer to form a plurality of vias in the polyimide layer, performing an oven curing process on the polyimide layer, and descumming the polyimide layer to remove excess residue.

The polyimide layer may be deposited using a spin coating process. The polyimide layer may be deposited using a spray coating process. The polyimide layer may be pre-baked prior to micro-imprinting. Baking the polyimide layer and the stamp inside the chamber may reduce a residual thickness layer disposed between the stamp and the substrate layer. Descumming the polyimide layer may be performed at a temperature between about 0 to 20 degrees Celsius. The descumming the polyimide layer may comprise etching the excess residue one or more times, performing a cooling process after each etch of the excess residue, and performing a cleaning process. Oxygen and tetrafluoro methane may be used to etch the excess residue. Helium or nitrogen may be used in the cooling process. Argon and hydrogen may be used in the cleaning process. A rim of each of the plurality of vias may be tapered following the cleaning process.

In another embodiment, a method of forming a plurality of vias in a panel comprises micro-imprinting a flowable epoxy layer with a stamp inside a chamber, the flowable epoxy layer comprising silica particle fillers, baking the flowable epoxy layer and the stamp inside the chamber, and removing the stamp from the flowable epoxy layer to form a plurality of vias in the flowable epoxy layer.

The stamp may have a multi-stamp layout. The stamp may have a full field layout. The method may further comprise exposing the flowable epoxy layer and the stamp to UV light prior to removing the stamp from the flowable epoxy layer and performing an oven curing process on the flowable epoxy layer after removing the stamp from the flowable epoxy layer. The flowable epoxy layer may comprise one or more materials that are flowable at a temperature between about 90-180 degrees Celsius. The flowable epoxy layer may be curable at a temperature greater than or equal to about 180 degrees Celsius. The flowable epoxy layer and the stamp may be baked inside the chamber at a temperature between about 180-200 degrees Celsius for about 1-5 minutes.

The method may further comprise depositing the flowable epoxy layer on a substrate layer prior to micro-imprinting the flowable epoxy layer. The flowable epoxy layer may be deposited by lamination. Micro-imprinting the flowable epoxy layer may comprises laminating the flowable epoxy layer on the stamp, attaching the stamp to a substrate layer, and baking the flowable epoxy layer and the stamp inside the chamber at a temperature between about 140-180 degrees Celsius. The stamp may be removed from the flowable epoxy layer at a temperature between about 140-180 degrees Celsius. The stamp may comprise a plurality of pillars having a height equal to or greater than a thickness of the flowable epoxy layer.

In yet another embodiment, a method of forming a plurality of vias in a panel comprises depositing a polyimide layer on a substrate layer using a drop coat process, micro-imprinting the polyimide layer with a stamp inside a chamber, baking the polyimide layer and the stamp inside the chamber, exposing the polyimide layer and the stamp to UV light, removing the stamp from the polyimide layer to form a plurality of vias in the polyimide layer, and performing an oven curing process on the polyimide layer.

Depositing the polyimide layer on the substrate layer using a drop coat process may comprise depositing drops of polyimide on the substrate layer in a cross-hatched pattern with controlled drop size and pitch. A residual thickness layer may be disposed between a bottom of each of the plurality of vias and a top of the substrate layer. The residual thickness layer may have a thickness of less than about 1 µm.

While the foregoing is directed to embodiments of the present disclosure, other and further embodiments of the disclosure may be devised without departing from the basic scope thereof, and the scope thereof is determined by the claims that follow.

What is claimed is:

1. A method of forming a plurality of vias in a panel, comprising:
    depositing a polyimide layer on a substrate layer using a drop coat process, the drop coat process comprising:
        depositing drops of polyimide on the substrate layer in a cross-hatched pattern with controlled drop size and pitch;
    micro-imprinting the polyimide layer with a stamp inside a chamber, the polyimide layer and the stamp heated to a temperature between about 50° C. and about 100° C. during the micro-imprinting;
    baking the polyimide layer and the stamp inside the chamber, the baking performed at a temperature between about 80° C. and about 120° C.;
    exposing the polyimide layer and the stamp to UV light;
    removing the stamp from the polyimide layer to form the plurality of vias in the polyimide layer;
    performing an oven curing process on the polyimide layer; and
    descumming the polyimide layer to remove excess residue.

2. The method of claim 1, wherein baking the polyimide layer and the stamp inside the chamber reduces a residual thickness layer disposed between the stamp and the substrate layer.

3. The method of claim 1, wherein descumming the polyimide layer is performed at a temperature between about 0 to 20 degrees Celsius.

4. The method of claim 3, wherein the descumming the polyimide layer comprises:
    etching the excess residue one or more times;
    performing a cooling process after each etch of the excess residue; and
    performing a cleaning process.

5. The method of claim 4, wherein oxygen and tetrafluoro methane are used to etch the excess residue, helium or nitrogen are used in the cooling process, and argon and hydrogen are used in the cleaning process.

6. The method of claim 4, wherein a rim of each of the plurality of vias is tapered following the cleaning process.

7. A method of forming a plurality of vias in a panel, comprising:
    depositing a polyimide layer on a substrate layer using a drop coat process, the drop coat process comprising:
        depositing drops of polyimide on the substrate layer in a cross-hatched pattern with controlled drop size and pitch;
    micro-imprinting the polyimide layer with a stamp inside a chamber, the polyimide layer and the stamp heated to a temperature between about 50° C. and about 100° C. during the micro-imprinting;
    baking the polyimide layer and the stamp inside the chamber, the baking performed at a temperature between about 80° C. and about 120° C.;
    exposing the polyimide layer and the stamp to UV light;
    removing the stamp from the polyimide layer to form a plurality of vias in the polyimide layer; and
    performing an oven curing process on the polyimide layer.

8. The method of claim 7, wherein the drops of polyimide are deposited on the substrate layer with a controlled drop size between about 440 µm and about 500 µm and a controlled pitch between about 500 µm and about 800 µm.

9. The method of claim 7, wherein a residual thickness layer is disposed between a bottom of each of the plurality of vias and a top of the substrate layer, wherein the residual thickness layer has a thickness of less than about 1 µm.

10. The method of claim 7, further comprising:
    descumming the polyimide layer to remove excess residue.

11. The method of claim 10, wherein descumming the polyimide layer is performed at a temperature between about 0 to 20 degrees Celsius.

12. The method of claim 11, wherein the descumming the polyimide layer comprises:
    etching the excess residue one or more times;
    performing a cooling process after each etch of the excess residue; and
    performing a cleaning process.

13. The method of claim 12, wherein oxygen and tetrafluoro methane are used to etch the excess residue, helium or nitrogen are used in the cooling process, and argon and hydrogen are used in the cleaning process.

14. The method of claim 12, wherein a rim of each of the plurality of vias is tapered following the cleaning process.

15. The method of claim 7, wherein baking the polyimide layer and the stamp inside the chamber reduces a residual thickness layer disposed between the stamp and the substrate layer.

16. A method of forming a plurality of vias in a panel, comprising:
- depositing a polyimide layer on a substrate layer using a drop coat process, the polyimide layer comprising an n-type photosensitive polyimide material, the drop coat process comprising:
  - depositing drops of polyimide on the substrate layer in a cross-hatched pattern with controlled drop size and pitch;
- micro-imprinting the polyimide layer with a stamp inside a chamber, the polyimide layer and the stamp heated to a temperature between about 50° C. and about 100° C. during the micro-imprinting;
- baking the polyimide layer and the stamp inside the chamber, the baking performed at a temperature between about 80° C. and about 120° C.;
- exposing the polyimide layer and the stamp to UV light;
- removing the stamp from the polyimide layer to form a plurality of vias in the polyimide layer;
- performing an oven curing process on the polyimide layer; and
- descumming the polyimide layer to remove excess residue.

17. The method of claim 16, wherein the descumming the polyimide layer comprises:
- etching the excess residue one or more times;
- performing a cooling process after each etch of the excess residue; and
- performing a cleaning process.

* * * * *